(12) United States Patent
Scherr

(10) Patent No.: US 7,096,168 B2
(45) Date of Patent: Aug. 22, 2006

(54) CIRCUIT CONFIGURATION FOR SIMULATING THE INPUT OR OUTPUT LOAD OF AN ANALOG CIRCUIT

(75) Inventor: Wolfgang Scherr, Liebenfels (AT)

(73) Assignee: Infineon Technologies AG, Munich (DE)

( * ) Notice: Subject to any disclaimer, the term of this patent is extended or adjusted under 35 U.S.C. 154(b) by 330 days.

(21) Appl. No.: 10/195,731

(22) Filed: Jul. 15, 2002

(65) Prior Publication Data

US 2003/0004700 A1    Jan. 2, 2003

Related U.S. Application Data

(63) Continuation of application No. PCT/EP01/00169, filed on Jan. 9, 2001.

(30) Foreign Application Priority Data

Jan. 13, 2000    (DE) ................ 100 01 154

(51) Int. Cl.
*G06G 7/48* (2006.01)
(52) U.S. Cl. ............ 703/4; 703/3; 703/13; 324/520; 324/519
(58) Field of Classification Search ............ 703/4, 703/14–16, 20, 28, 3; 716/4–6; 324/124, 324/519, 555, 520; 327/519; 73/811
See application file for complete search history.

(56) References Cited

U.S. PATENT DOCUMENTS

| | | | | |
|---|---|---|---|---|
| 3,631,232 A | * | 12/1971 | Perrault et al. ............ | 703/4 |
| 3,728,616 A | * | 4/1973 | Cheek et al. ............ | 324/538 |
| 3,916,306 A | * | 10/1975 | Patti ............ | 714/745 |
| 4,002,974 A | * | 1/1977 | Thomas ............ | 715/735 |
| 4,158,808 A | * | 6/1979 | Massa et al. ............ | 324/74 |
| 4,712,058 A | * | 12/1987 | Branson et al. ............ | 324/763 |
| 4,835,726 A | * | 5/1989 | Lewis ............ | 703/4 |
| 5,196,788 A | * | 3/1993 | Cistulli ............ | 324/158.1 |
| 5,717,359 A | | 2/1998 | Matsui et al. | |

(Continued)

FOREIGN PATENT DOCUMENTS

DE    195 40 647 A1    10/1996

(Continued)

OTHER PUBLICATIONS

Cathey, Nasar; "Theory and Problem of Basic Electrical Engineering"; 1984; McGraw-Hill, Inc.; pp. 156-157.*

(Continued)

*Primary Examiner*—Paul L. Rodriguez
*Assistant Examiner*—Jason Proctor
(74) *Attorney, Agent, or Firm*—Laurence A. Greenberg; Werner H. Stemer; Ralph E. Locher

(57) ABSTRACT

In order to simulate the input or output load of an analog circuit, the output of the analog circuit is connected to the input of a driver stage. A measuring element is placed between the input of the driver stage and the reference potential, in order to record the output voltage of the analog circuit. A digital simulator controls a controllable transfer impedance, arranged between the output of the driver stage and the reference potential, in order to simulate various output loads. An alternative is to connect the output of the driver stage to the input of the analog circuit. The input of the driver stage has a shunt connection of a controllable current or voltage source, a first resistance and a first capacitance. The digital simulator controls the controllable current or voltage source, in order to simulate various output loads. The driver stage is switched off when appropriate.

13 Claims, 3 Drawing Sheets

U.S. PATENT DOCUMENTS 5,945,822 A    8/1999   Shiotsuka
6,104,080 A    8/2000   Ehben
6,480,817 B1 * 11/2002  Peters et al. .................. 703/15

FOREIGN PATENT DOCUMENTS

DE     195 40 647 C2    10/1996
DE     197 36 197 C1     3/1999
GB        2274716 A  *   8/1994

OTHER PUBLICATIONS

Charles H. Roth, Jr.; "Fundamentals of Logic Design"; 1992; West Publishing Company; pp. 1-6.*

Kerry Lacanette, "A Basic Introduction to Filters—Active, Passive, and Switched Capacitor", Apr. 1991, National Semiconductor, pp. 1-22.*

Tietze, U. et al.: "Halbleiter-Schaltungstechnik" [semiconductor circuit technique], Springer-Verlag, 1974, p. 326.

Tietze/Schenk: "Halbleiter-Schaltungstechnik" [semiconductor circuit technology], 3$^{rd}$ ed., Springer Verlag Berlin, 1974, p. 326.

Jung-Chien Li et al.: "A Study On An AC Active Load Simulator", *Proceedings of the IEEE International Symposium on Industrial Electronics, China*, May 25, 1992, pp. 69-73, XP-002168966.

Stewart S. Taylor: "A High-Performance GaAs Pin Electronics Circuit for Automatic Test Equipment", *IEEE Journal of Solid-State Circuits*, vol. 28, No. 10, Oct. 1993, pp. 1023-1029, XP 000400097.

* cited by examiner

CIRCUIT CONFIGURATION FOR SIMULATING THE INPUT OR OUTPUT LOAD OF AN ANALOG CIRCUIT

CROSS-REFERENCE TO RELATED APPLICATION

This application is a continuation of copending International Application No. PCT/EP01/00169, filed Jan. 9, 2001, which designated the United States and was not published in English.

BACKGROUND OF THE INVENTION

Field of the Invention

The invention relates to a circuit configuration for simulating the input or output load of an analog circuit.

In order to simulate the input or output load of an analog circuit, it is known to provide controllable current or voltage sources that are controlled by a digital simulator. The output currents or output voltages of the controlled current or voltage sources are injected into the analog circuit via RC elements.

However, because such circuit configurations cannot simulate the input or the output load for analog circuits with critical input signals in a sufficiently realistic fashion, there is a need for an additional analog simulation.

SUMMARY OF THE INVENTION

It is accordingly an object of the invention to provide a circuit configuration for simulating an input load or output load of an analog circuit which overcomes the above-mentioned disadvantages of the prior art apparatus of this general type.

In particular, it is an object of the invention to provide a circuit configuration for simulating the input or output load of an analog circuit such that the simulation is performed realistically even in the case of critical input signals.

With the foregoing and other objects in view there is provided, in accordance with the invention, a circuit configuration for simulating an output load of an analog circuit. The circuit configuration includes: an electrical ground; a driver stage having an input connected to the output of the analog circuit; a measuring element connected between the input of the driver stage and the electrical ground in order to detect an output voltage of the analog circuit; a controllable coupling resistor connected between the output of the driver stage and the electrical ground; and a digital simulator having a control output. The controllable coupling resistor has a control input connected to the control output of the digital simulator.

With the foregoing and other objects in view there is also provided, in accordance with the invention, a circuit configuration for simulating an input load or output load of an analog circuit. The circuit configuration includes: a driver stage having an output connected to either an input or an output of the analog circuit; a parallel circuit having a first resistor, a first capacitor, and a first source, which can be, a controllable current source or a controllable voltage source. The parallel circuit is connected to the input of the driver stage. The circuit configuration also includes a digital simulator having a first control output. The first source has a control input connected to the first control output of the digital simulator.

In accordance with an added feature of the invention, there is provided, a further parallel circuit including a second resistor, a second capacitor, and a second source, which can be either a controllable current source or a controllable voltage source. The driver stage has an enable input connected to the further parallel circuit. The digital simulator has a second control output. The second source has a control input connected to the second control output of the digital simulator.

In accordance with an additional feature of the invention, there is provided, a measuring element for detecting an output voltage of the analog circuit. The measuring element is connected between the output of the driver stage and the electrical ground.

In accordance with another feature of the invention, the driver stage is constructed as an inverter stage.

In accordance with a further feature of the invention, the driver stage is designed using CMOS technology.

In accordance with a further added feature of the invention, a default driver is provided for the driver stage.

In accordance with a concomitant feature of the invention, RC elements are provided for decoupling the analog circuit.

Using a driver stage in the inventive way renders the simulation substantially more realistic without requiring a large technical outlay for this purpose.

Other features which are considered as characteristic for the invention are set forth in the appended claims.

Although the invention is illustrated and described herein as embodied in a circuit configuration for simulating the input or output load of an analog circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
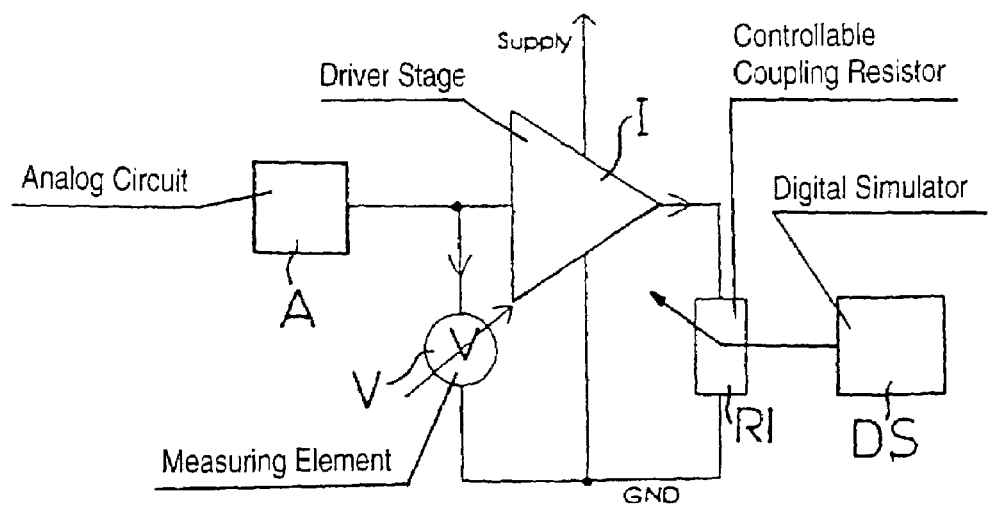
FIG. 1 shows an exemplary embodiment of the invention for simulating the output load of an analog circuit.

Referring now to the figures of the drawing in detail and first, particularly, to FIG. 1 thereof, there is shown a circuit configuration for simulating the output load of an analog circuit A. The output of the analog circuit A is connected to the input of a driver stage I. The output of the driver stage I is connected to ground via a controllable coupling resistor RI. The control input of the controllable coupling resistor RI is connected to the control output of a digital simulator DS. A measuring element V for detecting the output voltage of the analog circuit A is situated between the input of the driver stage I and ground.

The digital simulator DS simulates different output loads for the analog circuit A by varying the coupling resistance RI.

Figure 2:
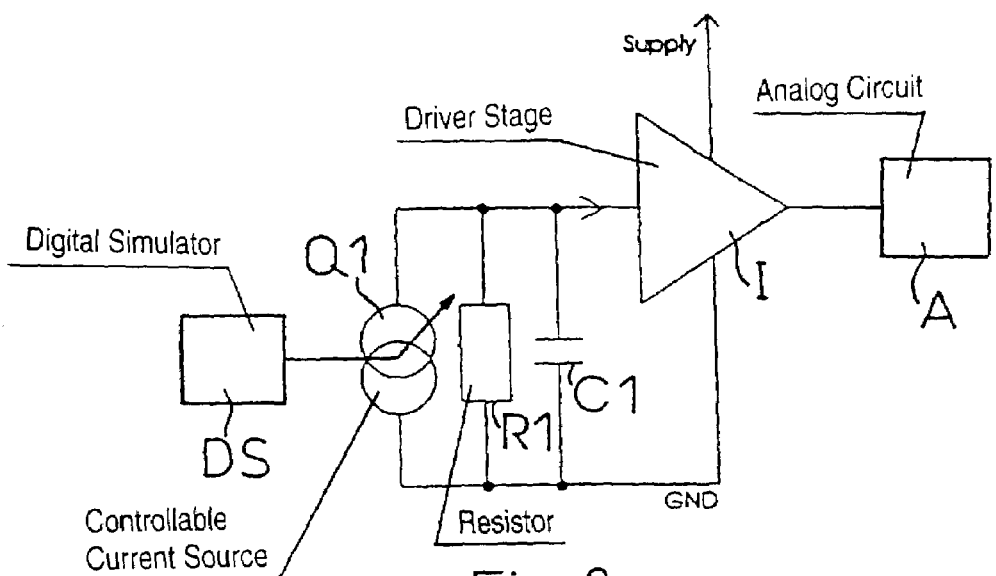
FIG. 2 shows an exemplary embodiment of the invention for simulating the input load of an analog circuit.

An inventive circuit configuration for simulating the input load of an analog circuit is shown in FIG. 2.

A parallel circuit composed of a controllable current source Q1, a resistor R1 and a capacitor C1 is connected to the input of a driver stage I. The control output of a digital simulator DS is connected to the control input of the controllable current source Q1. The output of the driver stage I is connected to the input of the analog circuit A.

The digital simulator DS controls the controllable current source Q1 in order to realistically simulate different input loads for the analog circuit A.

Figure 3:
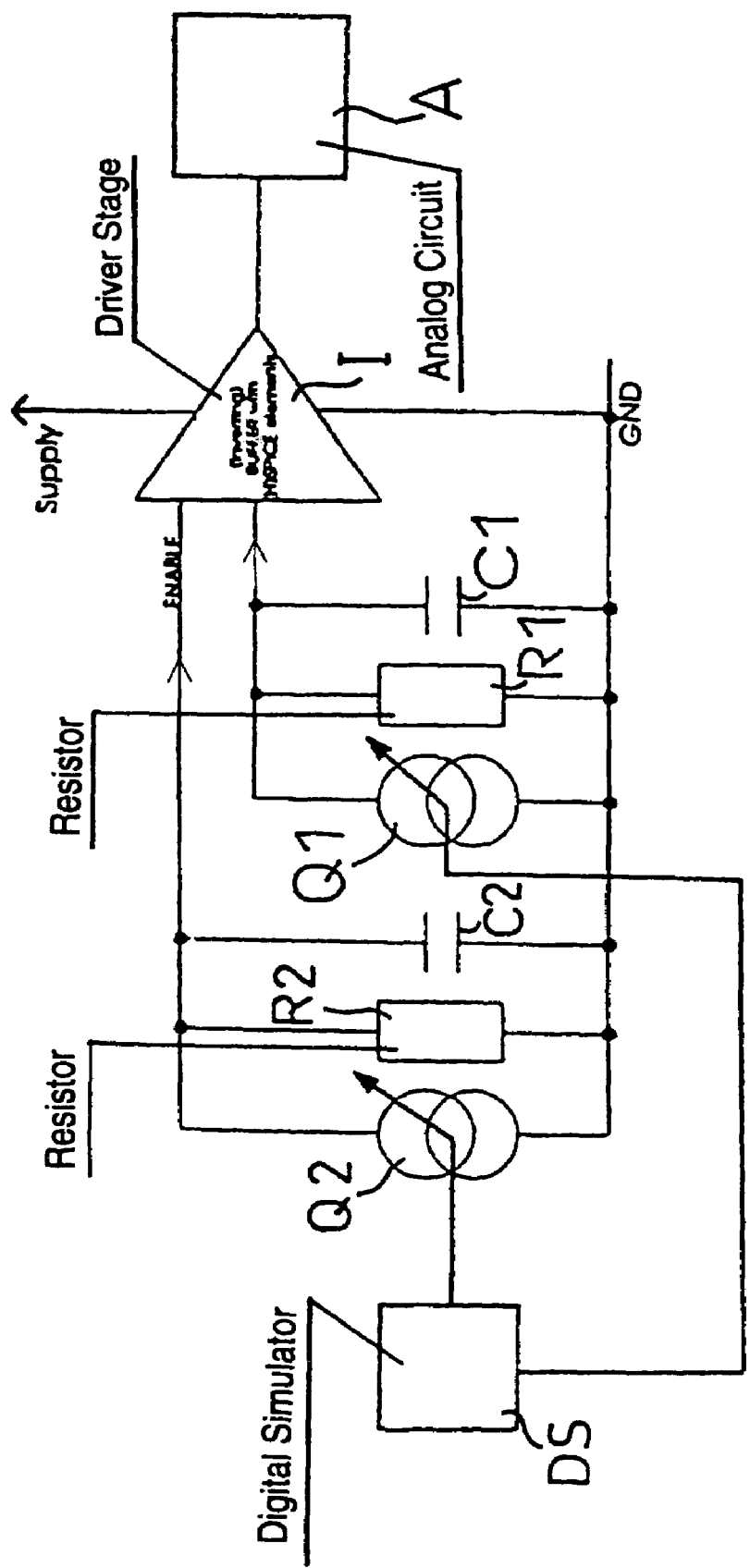
FIG. 3 shows an exemplary embodiment of the invention for simulating the input or output load of an analog circuit.

An exemplary embodiment of a configuration for simulating the input or output load of an analog circuit is illustrated in FIG. 3.

The exemplary embodiment illustrated in FIG. 3 has the same design as the exemplary embodiment shown in FIG. 2, but is supplemented by a parallel circuit composed of a second controllable current source Q2, a second resistor R2 and a second capacitor C2, which is connected to the ENABLE input of the driver stage I. The control input of the current source Q2 is connected to a second control output of the digital simulator DS.

When the input of an analog circuit A is connected to the output of the driver stage I, the digital simulator DS simulates different input loads for the analog circuit A by switching on the current source Q2 and controlling the current source Q1. If, by contrast, the output of the analog circuit A is connected to the output of the driver stage I, the driver stage I is switched off by the digital simulator DS.

Figure 4:
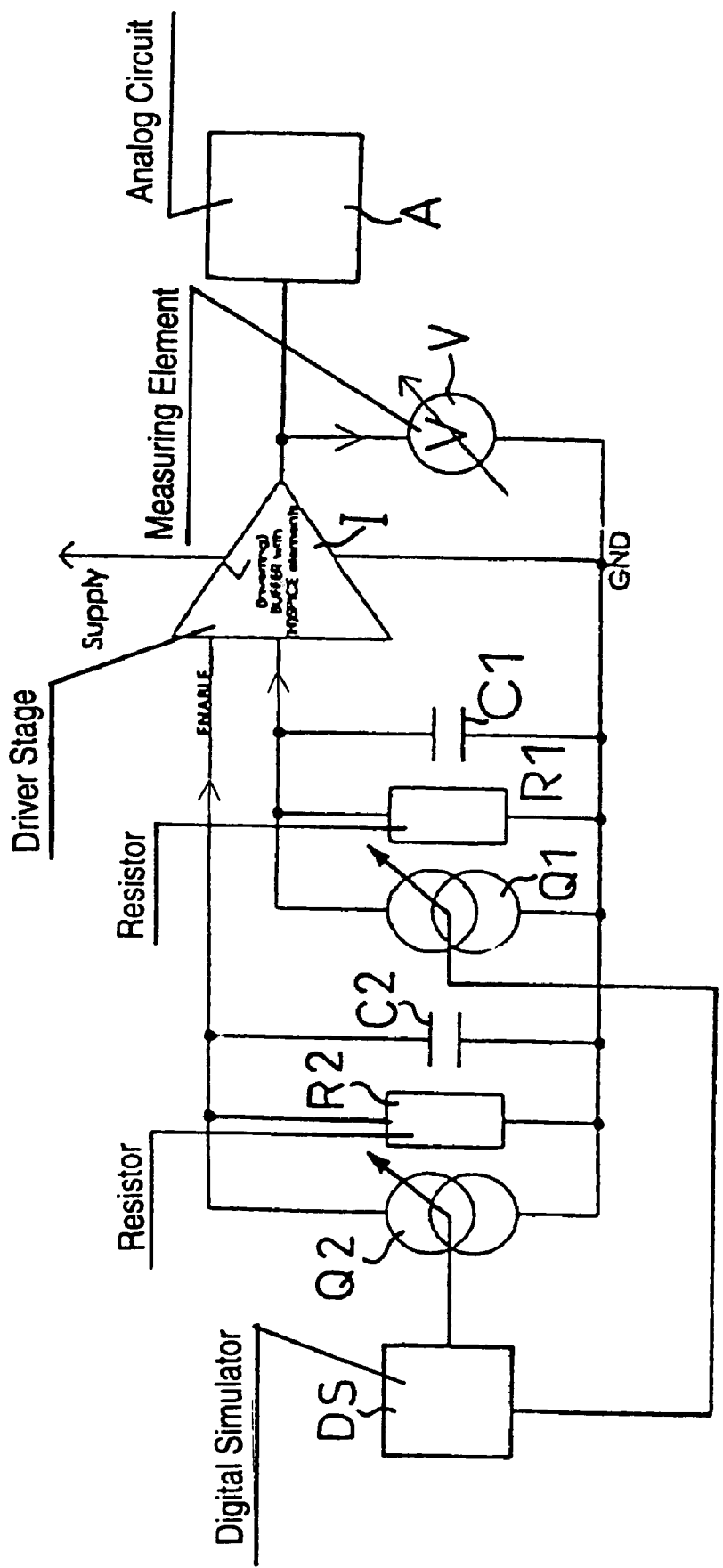
FIG. 4 shows a further exemplary embodiment of the invention for simulating the input or output load of an analog circuit.

A further exemplary embodiment of a configuration for simulating the input or output load of an analog circuit is shown in FIG. 4.

The exemplary embodiment illustrated in FIG. 4 has the same design as the exemplary embodiment shown in FIG. 3. A measuring element V is situated between the output of the driver stage I and ground in order to detect the output voltage of the analog circuit A.

It is particularly advantageous to provide a CMOS inverter stage or what is termed as a default driver for the driver stage I. Coupling to the analog circuit is preferably performed via an RC element.

The invention is distinguished by the advantage that it sufficiently realistically simulates the input or output load of an analog circuit with critical input signals such that additional simulations are no longer required.

I claim:

1. A circuit configuration for simulating an output load of an analog circuit having an output, comprising:
   an electrical ground;
   a driver stage having an input connected to the output of the analog circuit, said driver stage having an output;
   a measuring element connected between said input of said driver stage and the electrical ground in order to detect an output voltage of the analog circuit;
   a controllable coupling resistor connected between said output of said driver stage and the electrical ground; and
   a digital simulator having a control output;
   said controllable coupling resistor having a control input connected to said control output of said digital simulator.

2. The circuit configuration according to claim 1, comprising: RC elements for decoupling the analog circuit.

3. The circuit configuration according to claim 1, wherein: said driver stage is constructed as an inverter stage.

4. A circuit configuration for simulating an input load of an analog circuit, comprising:
   a driver stage having an output connected to an input terminal, of the analog circuit, said driver stage having an input;
   a parallel circuit including a first resistor, a first capacitor, and a first source, selected from a group consisting of, a controllable current source and a controllable voltage source, said parallel circuit connected to said input of said driver stage;
   a digital simulator having a first control output; and
   said first source having a control input connected to said first control output of said digital simulator.

5. The circuit configuration according to claim 4, comprising:
   a further parallel circuit including a second resistor, a second capacitor, and a second source, selected from a group consisting of, a controllable current source and a controllable voltage source;
   said driver stage having an enable input connected to said further parallel circuit;
   said digital simulator having a second control output;
   said second source having a control input connected to said second control output of said digital simulator.

6. The circuit configuration according to claim 5, wherein: said driver stage is constructed as an inverter stage.

7. The circuit configuration according to claim 5, comprising:
   a measuring element for detecting an output voltage of the analog circuit;
   said measuring element connected between said output of said driver stage and the electrical ground.

8. The circuit configuration according to claim 7, wherein: said driver stage is constructed as an inverter stage.

9. The circuit configuration according to claim 4, wherein: said driver stage is constructed as an inverter stage.

10. The circuit configuration according to claim 9, wherein: said driver stage is designed using CMOS technology.

11. The circuit configuration according to claim 10, comprising: a default driver for said driver stage.

12. The circuit configuration according to claim 9, comprising: a default driver for said driver stage.

13. The circuit configuration according claim 4, comprising: RC elements for decoupling the analog circuit.

* * * * *